United States Patent
Kishi

(10) Patent No.: US 8,076,961 B2
(45) Date of Patent: Dec. 13, 2011

(54) MONITORING APPARATUS AND COMPUTER-READABLE STORAGE MEDIUM

(75) Inventor: Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/659,848

(22) Filed: Mar. 23, 2010

(65) Prior Publication Data

US 2010/0176853 A1    Jul. 15, 2010

Related U.S. Application Data

(63) Continuation of application No. PCT/JP2007/069032, filed on Sep. 28, 2007.

(51) Int. Cl.
*H03L 7/06* (2006.01)
(52) U.S. Cl. ........................ 327/156; 327/161; 455/552.1
(58) Field of Classification Search .................. 327/156, 327/161; 455/552.1
See application file for complete search history.

(56) References Cited

U.S. PATENT DOCUMENTS

| | | | |
|---|---|---|---|
| 6,708,044 B1 * | 3/2004 | Puknat et al. | 455/552.1 |
| 7,228,117 B2 * | 6/2007 | Ichihara | 455/192.2 |

FOREIGN PATENT DOCUMENTS

| | | |
|---|---|---|
| JP | 62-213455 | 9/1987 |
| JP | 8-56153 | 2/1996 |
| JP | 11-55118 | 2/1999 |
| JP | 2000-183648 | 6/2000 |
| JP | 2000-261334 | 9/2000 |
| JP | 2003-264460 | 9/2003 |
| JP | 2004-282118 | 10/2004 |
| JP | 2007-243783 | 9/2007 |

OTHER PUBLICATIONS

International Search Report for PCT/JP2007/069032, mailed Jan. 8, 2008.

\* cited by examiner

*Primary Examiner* — Lincoln Donovan
*Assistant Examiner* — John Poos
(74) *Attorney, Agent, or Firm* — Staas & Halsey LLP

(57) ABSTRACT

A monitoring apparatus monitors a system including an oscillator with a variable oscillation frequency. The monitoring apparatus has a transmitting unit to transmit an information collecting instruction for collecting state information of the system to the system at an arbitrary monitoring timing, and a control unit to perform a control operation that includes transmitting to the system control information for controlling the oscillation frequency to become a reference value or less if the oscillation frequency exceeds the reference value, and computing a changing amount of the oscillation frequency at least due to aging and a next monitoring timing.

16 Claims, 8 Drawing Sheets

CORRECTION INFORMATION

MONITORING APPARATUS AND COMPUTER-READABLE STORAGE MEDIUM

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2007/069032 filed on Sep. 28, 2007, in the Japanese Patent Office, the disclosure of which is hereby incorporated by reference.

FIELD

The present invention generally relates to monitoring apparatuses and computer-readable storage media, and more particularly to a monitoring apparatus for monitoring a system having an oscillator, and a computer-readable storage medium that stores a program which, when executed by a computer, causes the computer to perform a process to monitor the system having the oscillator.

In this specification, a monitoring apparatus refers to an apparatus that has a function of monitoring a state of a system, which is a monitoring target, and controlling an oscillator within the system according to a result of the monitoring.

BACKGROUND

A system having an oscillator is used in various kinds of electronic apparatuses, including portable or mobile telephones. In such a system, various operations are performed using an oscillation frequency of the oscillator as a reference, and thus, the oscillation frequency must be maintained constant. However, in actual practice, the oscillation frequency of the oscillator may vary depending on various causes.

The oscillation frequency of the oscillator may vary due to initial deviation, temperature characteristic, power supply fluctuation, aging, and change in environment. Amongst such causes of the oscillation frequency variation, the initial deviation, the temperature characteristic and the power supply fluctuation may be detected prior to forwarding of the electronic apparatus, and such causes may be corrected.

In this specification, the aging refers to a change in the characteristic of the oscillator caused by the aging of constituent elements of the oscillator, and the aging differs for each individual oscillator. In addition, the change in environment refers to a change in the characteristic of the oscillator caused by the change in the environment of the oscillator. For example, the temperature of the environment of the oscillator changes depending on the time of season, and the characteristic of the oscillator also changes depending on the time of season. However, a temperature change depending on the time of season is different for each year.

The aging and the change in the environment are corrected using predicted values. For this reason, in a case where the oscillation frequency of the oscillator shows an unexpected behavior, that could not be predicted by the predicted values, due to the aging or the change in the environment, the oscillation frequency cannot be corrected appropriately. In addition, the aging is caused, for example, by corrosion of an electrode of the oscillator element (crystal) of the oscillator, stress on the electrode at the time of mounting that is released with time, and the like. Further, the change in the environment is caused by the time of season, for example. Accordingly, it is impossible to completely eliminate the change in the oscillation frequency caused by the aging or the change in the environment, by modifying the structural design or the fabrication process of the oscillator.

For example, a Japanese Laid-Open Patent Publication No. 11-55118 proposes a method of writing control data of a programmable oscillator. In addition, a Japanese Laid-Open Patent Publication No. 2000-261334 proposes a method of controlling a voltage controlled oscillator having a variable oscillation frequency based on an external control voltage and a reference clock. In addition, a Japanese Laid-Open Patent Publication No. 2003-264460 proposes a monitoring method that outputs an alarm if an output of the voltage controlled oscillator falls outside a predetermined range.

In the conventional system having the oscillator, there was a problem in that the oscillation frequency of the oscillator cannot be corrected appropriately even if the predicted values is used, in the case where the oscillation frequency of the oscillator shows an unexpected behavior, that could not be predicted by the predicted values, due to the aging or the change in the environment.

SUMMARY

Accordingly, it is an object in one aspect of the invention to provide a monitoring apparatus and a computer-readable storage medium, in which the problem described above is suppressed.

It is an object in one aspect of the present invention to provide a monitoring apparatus and a computer-readable storage medium, which can appropriately correct an oscillation frequency of an oscillator even when the oscillator shows an unexpected behavior.

According to one aspect of the present invention, there is provided a monitoring apparatus for monitoring a system that includes an oscillator having a variable oscillation frequency, comprising a storing unit configured to store a reference value of state information of the system, including at least frequency information related to an oscillation frequency of the oscillator, and changing amount information, including at least changing amount information related to an anticipated changing amount of the oscillation frequency the oscillator due to aging of the oscillator; a transmitting unit configured to transmit an information collecting instruction for collecting the state information of the system to the system at an arbitrary monitoring timing; and a control unit configured to perform a control operation that includes transmitting to the system control information for controlling the oscillation frequency to become the reference value or less if the oscillation frequency exceeds the reference value, based on a result of comparing state information collected and received from the system and the reference value of the state information stored in the storing unit, computing the changing amount of the oscillation frequency at least due to aging based on a result of comparing state information collected at a previous monitoring timing and state information collected at a present monitoring timing and the changing amount information stored in the storing unit, and computing a next monitoring timing based on the computed changing amount of the oscillation frequency and storing this next monitoring timing in the storing unit.

According to one aspect of the present invention, there is provided a computer-readable storage medium that stores a program which, when executed by a computer, causes the computer to perform a monitoring process to monitor a system that includes an oscillator having a variable oscillation frequency, said program comprising a transmitting procedure causing the computer to transmit an information collecting instruction for collecting state information of the system to the system at an arbitrary monitoring timing; and a control procedure causing the computer to perform a control operation that includes transmitting to the system control information for controlling an oscillation frequency of the oscillator to become a reference value or less if the oscillation frequency exceeds the reference value, based on a result of comparing state information collected and received from the system and the reference value of the state information stored in the storing unit which stores the reference value of state information of the system, including at least frequency information related to the oscillation frequency of the oscillator, and changing amount information, including at least changing amount information related to an anticipated changing amount of the oscillation frequency of the oscillator due to aging of the oscillator, computing the changing amount of the oscillation frequency at least due to aging based on a result of comparing state information collected at a previous monitoring timing and state information collected at a present monitoring timing and the changing amount information stored in the storing unit, and computing a next monitoring timing based on the computed changing amount of the oscillation frequency and storing this next monitoring timing in the storing unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
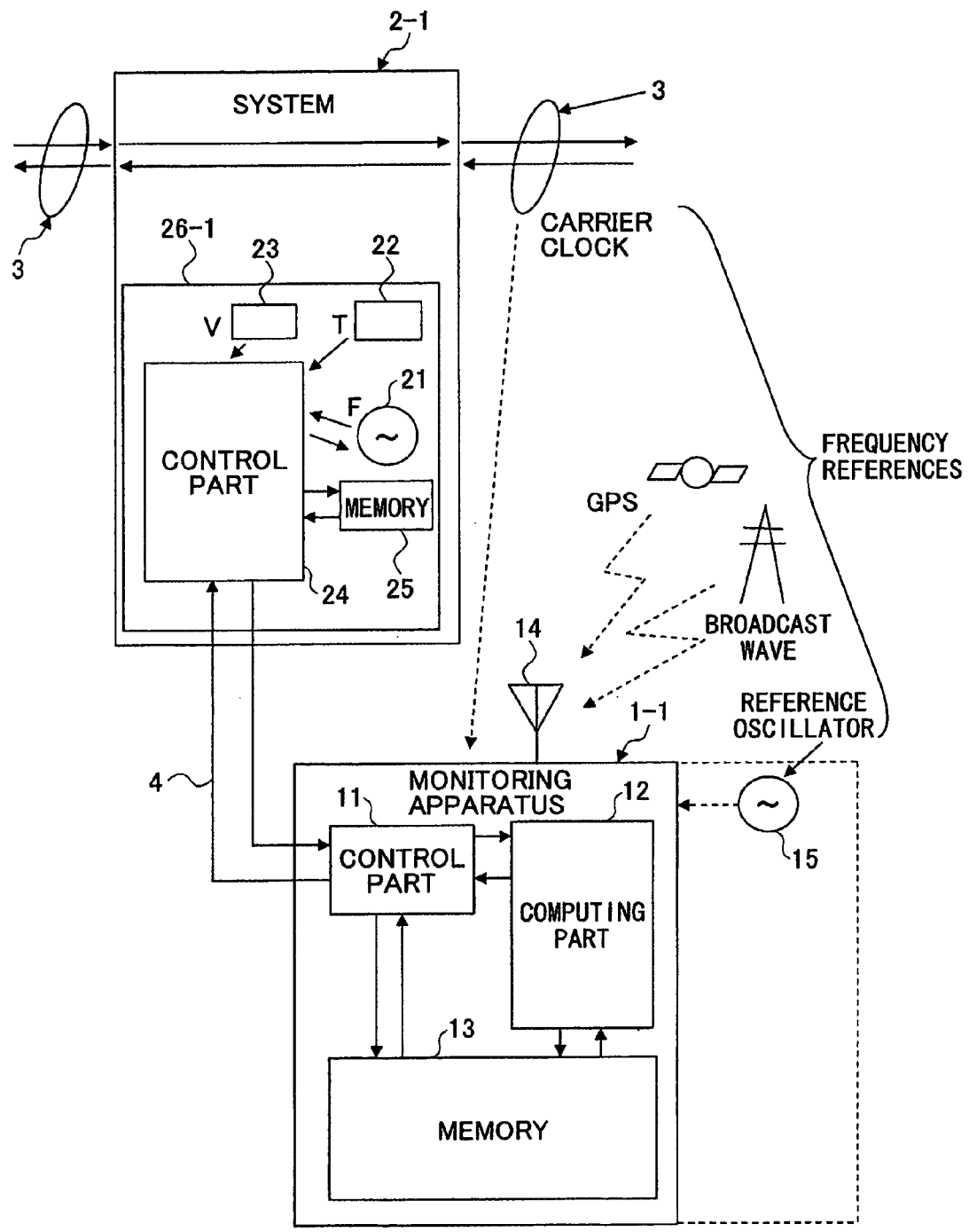
FIG. 1 is a block diagram for explaining a first embodiment of the present invention.

Preferred embodiments of the present invention will be described with reference to the accompanying drawings.

According to one aspect of the embodiments, an oscillation frequency of an oscillator within a system after forwarding thereof is monitored, and the oscillator is controlled in order to correct the oscillation frequency before the change in the oscillation frequency exceeds a tolerable range of the system. By correcting the change in the oscillation frequency caused by aging or a change in the environment, such as a change of season, it becomes possible to obtain an accurate and stable oscillation output that is suited for use as a system clock and the like. The oscillation frequency is monitored during operation of the system, however, the correction of the oscillation frequency is not limited to during operation of the system if the system accepts information for correcting the oscillation frequency.

In addition, according to one aspect of the embodiments, it is possible to minimize the required estimate of the amount of change in the oscillation frequency due to the aging and the change in environment. Consequently, the design margin for other changing elements of the oscillation frequency, such as the initial deviation, the temperature characteristic and the power supply change, may be increased to thereby improve the yield of the oscillator itself. Thus, the system may use an oscillator having a relatively low cost. In addition, it is possible to appropriately correct the oscillation frequency of the oscillator even when the oscillator shows an unexpected behavior.

Next, a description will be given of a monitoring apparatus and a computer-readable storage medium in the embodiments of the present invention, by referring to the drawings.

FIG. 1 is a block diagram for explaining a first embodiment of the present invention. A monitoring apparatus 1-1 includes a control part 11, a computing part 12, a memory 13, and a receiving part 14 that includes an antenna. The control part 11 and the computing part 12 may be formed by a processor, such as a Central Processing Unit (CPU). A system 2-1, which is a monitoring target of the monitoring apparatus 1-1, includes a monitored circuit part 26-1. The monitored circuit part 26-1 includes an oscillator 21 having a variable oscillation frequency, a temperature detecting part 22, a power supply voltage detecting part 23, a control part 24, and a memory 25. The control part 24 may be formed by a processor, such as a CPU. The monitoring apparatus 1-1 and the system 2-1 are connected via a leased line (or private circuit) 4. In this embodiment, the present invention is applied to the monitoring and control of a portable telephone, for example, and the system 2-1 is connectable to a communication line 3. The communication line 3 is formed by an analog line, for example. Of course, a plurality of systems 2-1 may be provided as monitoring targets of the monitoring apparatus 1-1.

In the monitoring apparatus 1-1, the memory 13 functions as a storing unit or storing means to store a reference value of state information related to the system 2-1, and changing amount information related to the oscillator 21. The state information related to the system 2-1 includes frequency information related to the oscillation frequency of the oscillator 21, power supply information related to a power supply voltage of the oscillator 21, and temperature information related to a temperature of the oscillator 21. The changing amount information includes changing amount information related to an anticipated (or estimated) changing amount of the oscillation frequency of the oscillator 21 due to aging, and changing amount information related to an anticipated (or estimated) changing amount of the oscillation frequency of the oscillator 21 due to an environment of the oscillator 21. The state information may include at least the frequency information, and the changing amount information may include at least the anticipated changing amount of the oscillation frequency of the oscillator 21 due to aging of the oscillator 21. The control part 11 functions as a transmitting unit or transmitting means to transmit an information collecting instruction for collecting the state information of the system 2-1 to the system 2-1 via the leased line 4 at an arbitrary monitoring timing (or time). In addition, the control part 11 functions as a control unit or control means to perform the following control operation. This control operation includes transmitting to the system 2-1 via the leased line 4 control information (or correction information) for controlling the oscillation frequency to become the reference value or less if the oscillation frequency exceeds the reference value, based on a comparison result of the computing part 12 which compares the state information collected and received from the system 2-1 and the reference value of the state information stored in the memory 13. The control operation also includes computing the changing amount of the oscillation frequency at least due to aging by the computing part 12, based on the comparison result of the computing part 12 which compares the state information collected at a previous monitoring timing and the state information collected at a present (or current) monitoring timing and the changing amount information stored in the memory 13. The control operation further includes computing a next monitoring timing based on the computed changing amount of the oscillation frequency and storing this next monitoring timing in the memory 13. The control part 11 may transmit the control information to the system 2-1 via the leased line 4 after storing the control information in the memory 13.

The arbitrary monitoring timing is a starting time (or a startup time) of the monitoring apparatus 1-1. The control part 11 that functions as the control unit or the control means may transmit an alarm to the system 2-1 via the leased line 4 when the computed changing amount of the oscillation frequency due to the aging exceeds an anticipated (or estimated) aging range. In other words, the monitoring apparatus 1-1 collects the state information of the system 2-1, including at least the frequency information related to the oscillation frequency of the oscillator 21, and corrects the oscillation frequency based on the state information if at least the changing amount information related to the changing amount of the oscillation frequency of the oscillator 21 due to the aging of the oscillator 21 falls within the anticipated aging range. On the other hand, the monitoring apparatus 1-1 corrects the oscillation frequency of the oscillator 21 and transmits the alarm if at least the changing amount information related to the changing amount of the oscillation frequency of the oscillator 21 due to the aging of the oscillator 21 does not fall within the anticipated aging range.

A reference clock that is used by the control part 11 when monitoring the state information of the system 2-1 may be selected from a group consisting of an output of a calibrated internal oscillator 15 provided within the monitoring apparatus 1-1, an output of a calibrated external oscillator (not illustrated) provided externally to the monitoring apparatus 1-1, a carrier clock on the communication line 3, a clock on a broadcast wave, and a clock on a Global Positioning System (GP) wave, as indicated by dotted lines in FIG. 1.

In this embodiment, the oscillator 21 within the system 2-1 is formed by a programmable oscillator. For this reason, the oscillation frequency of the oscillator 21 is controlled based on correction information written in the memory 25. The frequency information F related to the oscillation frequency of the oscillator 21, the power supply information V related to the power supply voltage of the oscillator 21 detected by the power supply voltage detecting part 23, and the temperature information T related to the temperature of the oscillator 21 detected by the temperature detecting part 22 are supplied to the control part 24 and stored in the memory 25. When the information collecting instruction is received from the monitoring apparatus 1-1 via the leased line 4, the control part 24 transmits the oscillation frequency information F, the power supply voltage information V and the temperature information T stored in the memory 25 to the monitoring apparatus 1-1 via the leased line 4, as the state information. In addition, when the control information is received from the monitoring apparatus 1-1 via the leased line 4, the control part 24 writes the control information into the memory 25 as the correction information in order to control the oscillation frequency of the oscillator 21.

Figure 2:
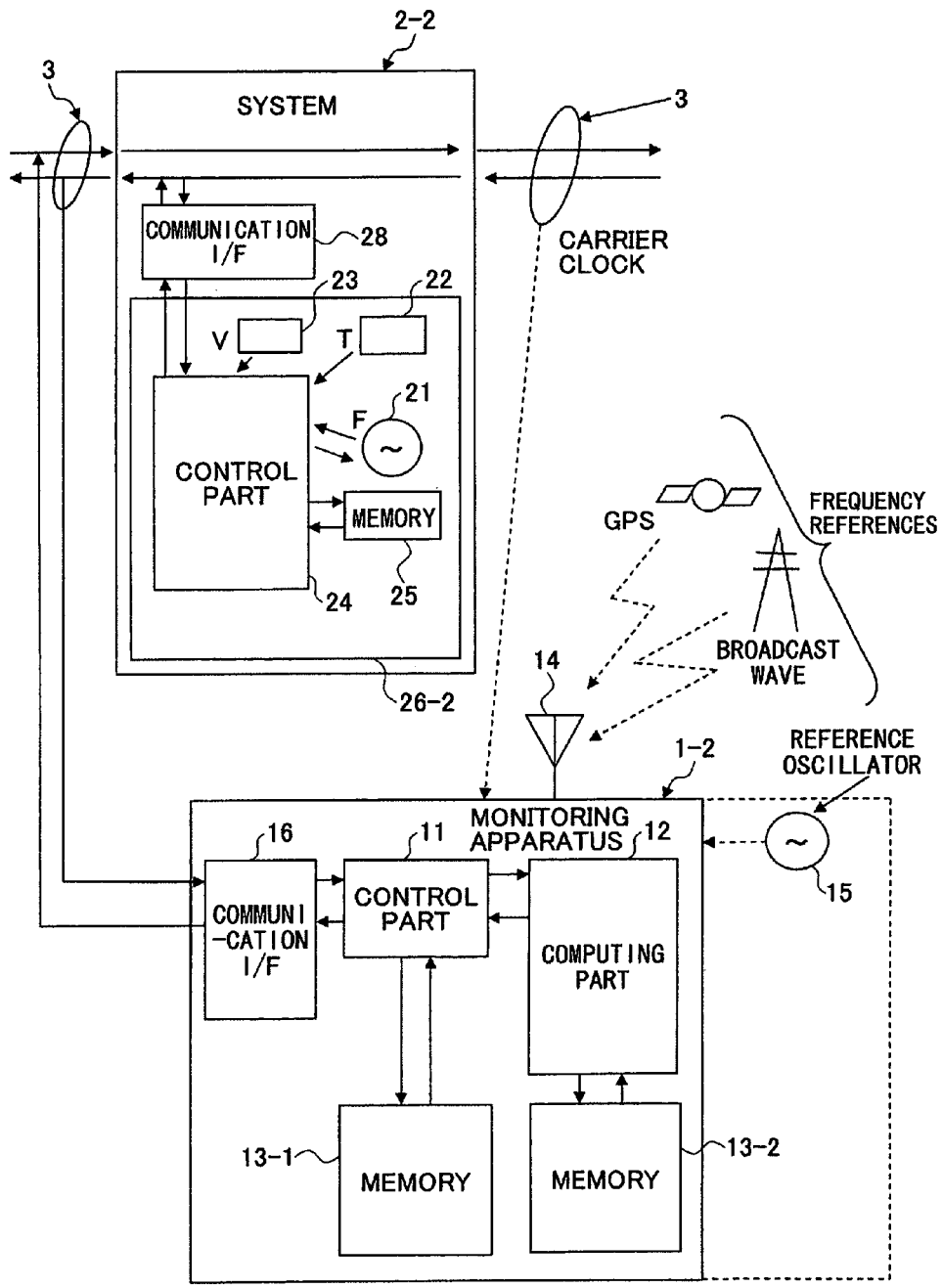
FIG. 2 is a block diagram for explaining a second embodiment of the present invention.

FIG. 2 is a block diagram for explaining a second embodiment of the present invention. In FIG. 2, those parts that are the same as those corresponding parts in FIG. 1 are designated by the same reference numerals, and a description thereof will be omitted.

In this embodiment, a monitoring apparatus 1-2 is not connected directly to a system 2-2 that is operating. In other words, instead of connecting the monitoring apparatus 1-2 directly to the system 2-2 in operation, the monitoring apparatus 1-2 is connected to the system 2-2 in operation via a communication line 3. For this reason, the monitoring apparatus 1-2 has a communication interface (I/F) 16 configured to connect to the communication line 3. A memory part is formed by a memory 13-1 configured to store the state information (frequency information F, the power supply information P, and the temperature information T) and the control information (correction information), and a memory 13-2 for storing the reference values of each state information, the changing amount information related to the anticipated changing amount of the oscillation frequency of the oscillator 21 due to aging of the oscillator 21, the changing amount information related to the changing amount of the oscillation frequency of the oscillator 21 due to the environment of the oscillator 21, intermediate results of the computation processes executed by the computing part 12, and the like. Although the memory part of this embodiment is formed by the two memories 13-1 and 13-2, it is of course possible to form the memory part by a single memory 13 as in the case of the first embodiment described above.

On the other hand, the system 2-2 has a communication interface (I/F) 28 configured to connected to the communication line and a monitored circuit part 26-1. The communication between the monitoring apparatus 1-2 and the system 2-2 is performed via the communication I/F 16, the communication line 3 and the communication I/F 28.

Of course, a plurality of systems 2-2 may be provided as monitoring targets of the monitoring apparatus 1-2.

Figure 3:
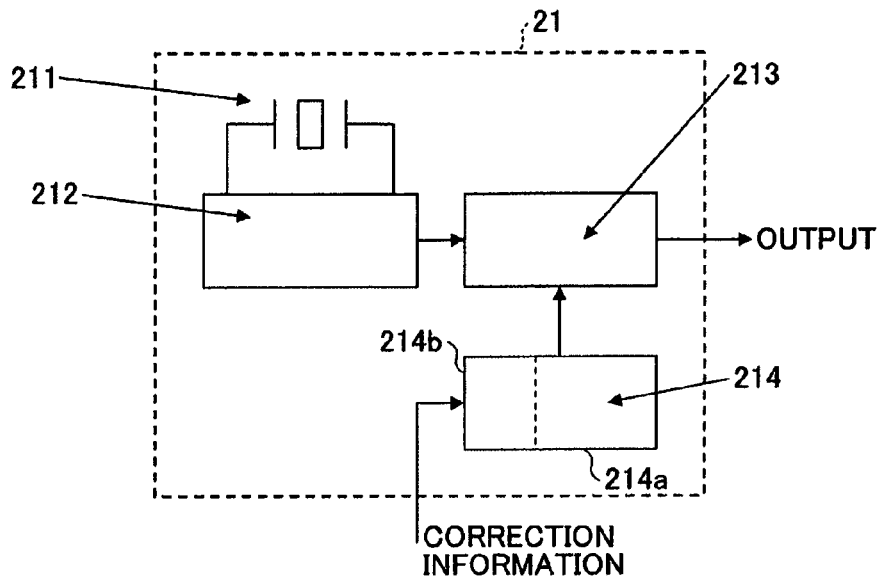
FIG. 3 is a block diagram illustrating an example of an oscillator.

FIG. 3 is a block diagram illustrating an example of the oscillator 21 illustrated in FIGS. 1 and 2. The programmable oscillator 21 illustrated in FIG. 3 has a structure including a Phase Locked Loop (PLL) circuit. A normal or conventional oscillator generates an output by adjusting the frequency of the oscillator element. However, the programmable oscillator 21 illustrated in FIG. 3 has a structure that maintains the oscillation frequency of a crystal oscillator element 211 constant, and varies the oscillation frequency by digitally processing the output of an oscillator circuit 212 by the PLL and a buffer circuit 213 depending on the correction information written in a memory 214. The memory 214 illustrated in FIG. 3 corresponds to the memory 25 illustrated in FIGS. 1 and 2. This memory 214 is divided into a basic information storage part 214a and an information storage part 214b. The basic information storage part 214a is non-rewritable, and is configured to stored fixed correction information for correcting an initial deviation, a temperature characteristic, a power supply change, and the like. On the other hand, the information storage part 214b is freely rewritable an arbitrary number of times, and is configured to store the rewritable correction information for correcting the aging, the change in environment, and the like.

The fixed correction information stored in the memory 214 (or memory 25) is related to the oscillator 21 having a nominal center frequency F0 of 25 MHz, and a stability of F0±100 ppm including the aging of 20 years, for example. The standard (or designed value) of the initial deviation information is F0±30 ppm (at a temperature of 25° C. and a power supply voltage of 3.3 V), and is F0±10 ppm at the time of forwarding the oscillator 21, for example.

Figure 4:
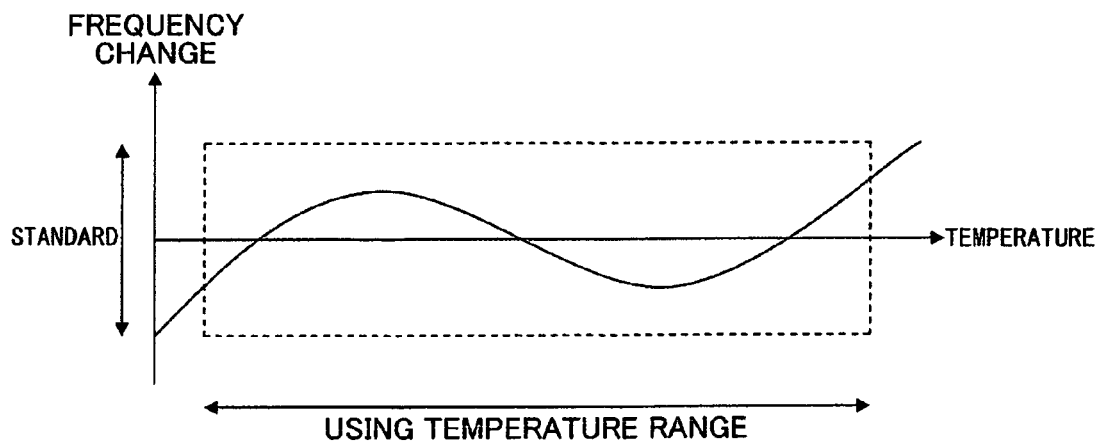
FIG. 4 is a diagram illustrating an example of a temperature change characteristic.

The temperature characteristic of a general crystal oscillator is a third order curve having inflection points at room temperature. Due to errors generated during the fabrication process and the like, this temperature characteristic may deviate from the third order curve. Hence, constants of a fifth order fitting function illustrated in FIG. 4, for example, are used as the fixed correction information. FIG. 4 is a diagram illustrating an example of the temperature change characteristic. In FIG. 4, the ordinate indicates the frequency change of the oscillation frequency in arbitrary units, and the abscissa indicates the temperature in arbitrary unit. A region surrounded by dotted lines in FIG. 4 indicates a using temperature range that is used and is within the standard. The standard of the temperature characteristic information is F0±30 ppm (at a temperature in a range of −40° C. to +85° C. and a power supply voltage of 3.3 V), for example.

Figure 5:
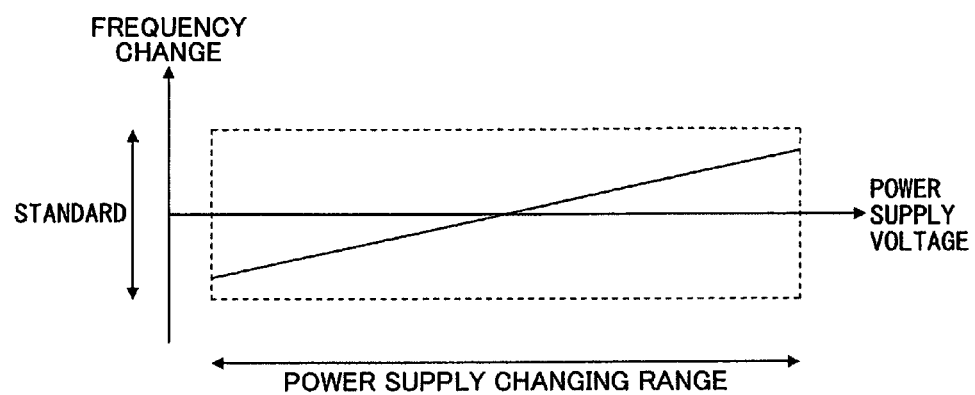
FIG. 5 is a diagram illustrating an example of a power supply change characteristic.

The power supply changing information varies approximately linearly, and for example, constants of a third order fitting function illustrated in FIG. 5 are used as the fixed correction information. The standard of the power supply changing information is F0±10 ppm (at a temperature of 25° C. and a power supply voltage of 3.3 V±10%), for example. FIG. 5 is a diagram illustrating an example of the power supply change characteristic. In FIG. 5, the ordinate indicates the frequency change of the oscillation frequency in arbitrary units, and the abscissa indicates the power supply voltage in arbitrary unit. A region surrounded by dotted lines in FIG. 5 indicates a power supply changing range that is within the standard.

Figure 6:
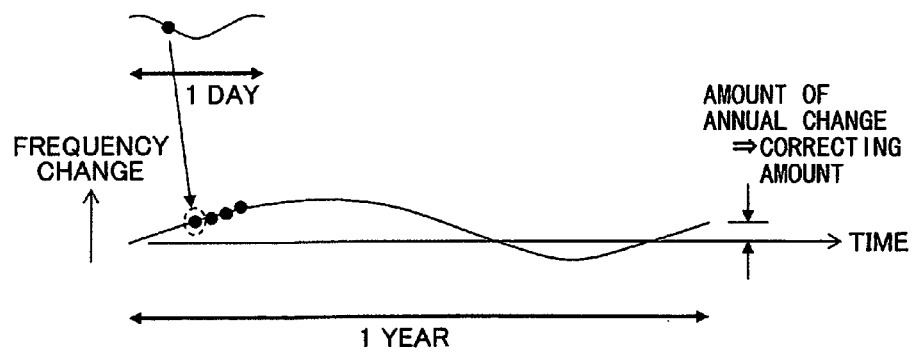
FIG. 6 is a diagram illustrating an example of an aging change characteristic.

The frequency change of the oscillation frequency does not occur rapidly with aging, and the change is on the order of several ppm per year, for example. For this reason, the change due to the aging must be corrected by detecting the amount of change several times a year, for example, by monitoring the temperature change in one day, the seasonal change at annual periods, and the like. FIG. 6 is a diagram illustrating an example of the aging change characteristic. In FIG. 6, the ordinate indicates the frequency change of the oscillation frequency in arbitrary units, and the abscissa indicates the time in arbitrary unit. A portion of the frequency change surrounded by dotted lines in FIG. 6 is illustrated on an enlarged scale with an expanded time base in a top left part of FIG. 6.

The aging of the general crystal oscillator undergoes a logarithmic change. Hence, the fixed correction information, that is, the aging information related to the aging standard, anticipates (or estimates) a change of F0±30 ppm (at a temperature of 25° C. and a power supply voltage of 3.3 V) in 20 years or 7300 days, for example. In this case, the fixed correction information anticipates a change of approximately F0±7.8 ppm per decade. One decade corresponds to the exponent part of the logarithmic representation, and when the first day is regarded as the starting point, 20 years (or 7300 days) is $10^{3.86}$ days, that is, 3.86 decades. Hence, the anticipated change of approximately F0±7.8 ppm/decade is obtained by dividing F0±30 ppm by 3.86.

The frequency change of the oscillation frequency due to the environment, particularly the temperature of the environment, does not occur rapidly, and the change is on the order of several ppm per year, for example. For this reason, the change due to the environment must be corrected by detecting the amount of change several times a year, for example, by monitoring the temperature change in one day, the seasonal change at annual periods, and the like. Accordingly, the environment information related to the standard of the frequency change of the oscillation frequency due to the environment may be obtained in a manner similar to obtaining the aging information related to the aging standard described above.

Figure 7:
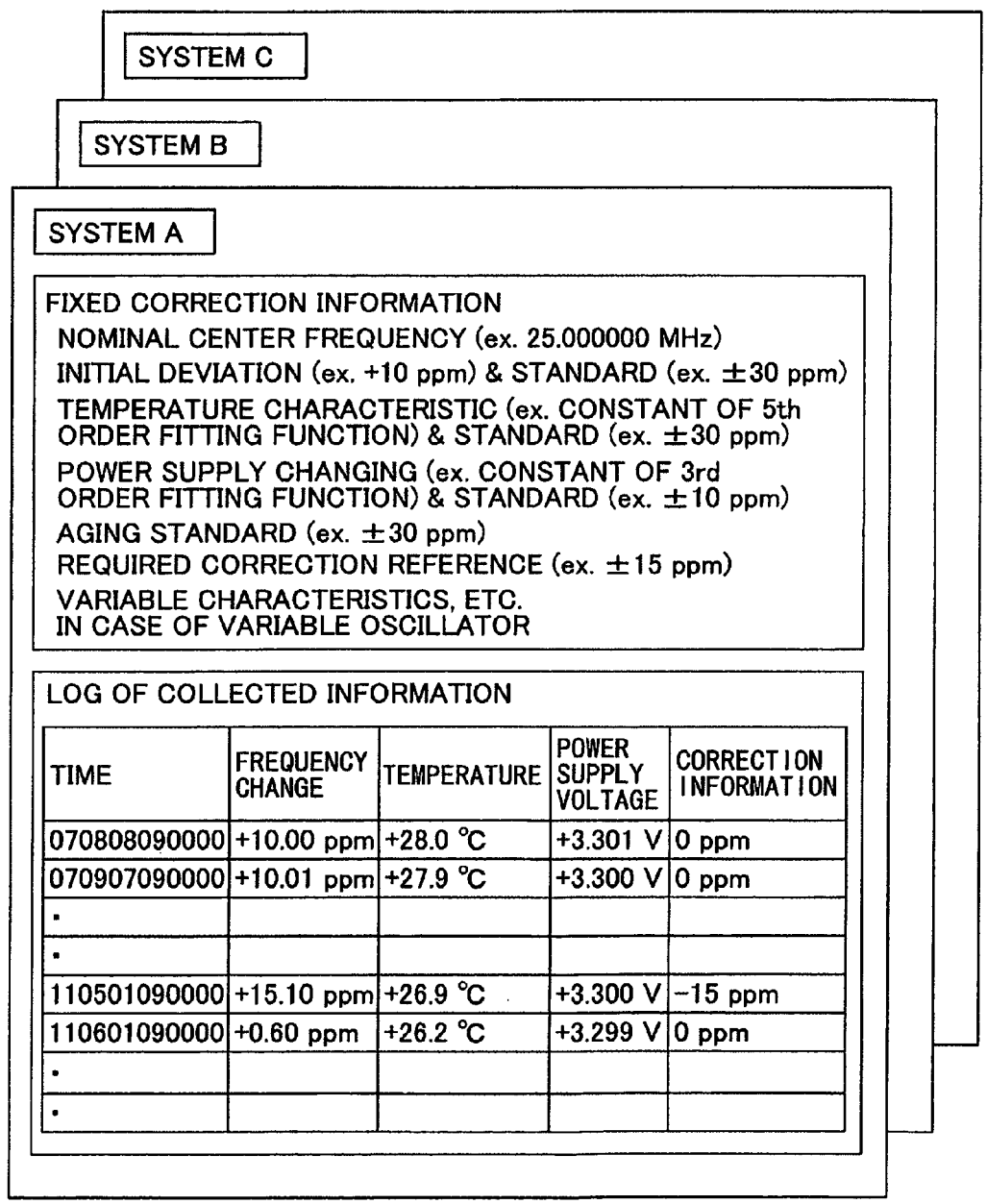
FIG. 7 is a diagram for explaining an example of information stored in a memory of a monitoring apparatus.

FIG. 7 is a diagram for explaining an example of information stored in the memory 13 (or memories 13-1 and 13-2) of the monitoring apparatus 1-1 (or 1-2). FIG. 7 illustrates the information that is stored in the memory 13 (or memories 13-1 and 13-2) with respect to a plurality of systems A, B, C, . . . when the monitoring apparatus 1-1 (or 1-2) monitors the plurality of systems A, B, C, . . . . Each of the systems A, B, C, . . . has a structure similar to that of the system 2-1 (or 2-2) described above.

In the case illustrated in FIG. 7, the memory 13 (or 13-2) stores, as the fixed correction information with respect to the system A, the information related to the nominal center frequency, the initial deviation information related to the initial deviation and standard, the temperature characteristic information related to the temperature characteristic and standard, the power supply changing information related to the power supply change and standard, the aging standard related to the aging standard, the required correction reference for judging whether the correction of the oscillation frequency is required, the variable characteristic of the oscillator 21 in the case where the oscillator 21 is formed by a variable oscillator, and the like. In this case, it is assumed for the sake of convenience that the aging standard includes the standard of the frequency change due to the environment. In addition, the memory (or 13-1) stores a log of the information collected from the system 1-1 (or 1-2). The log of the collected information includes the time when the information was collected, the frequency change of the oscillation frequency, the temperature, the power supply voltage, the value of the correction information, and the like. The fixed correction information and the log illustrated in FIG. 7 is used by the computation process executed by the control part 11 and/or the computing part 12.

Figure 8:
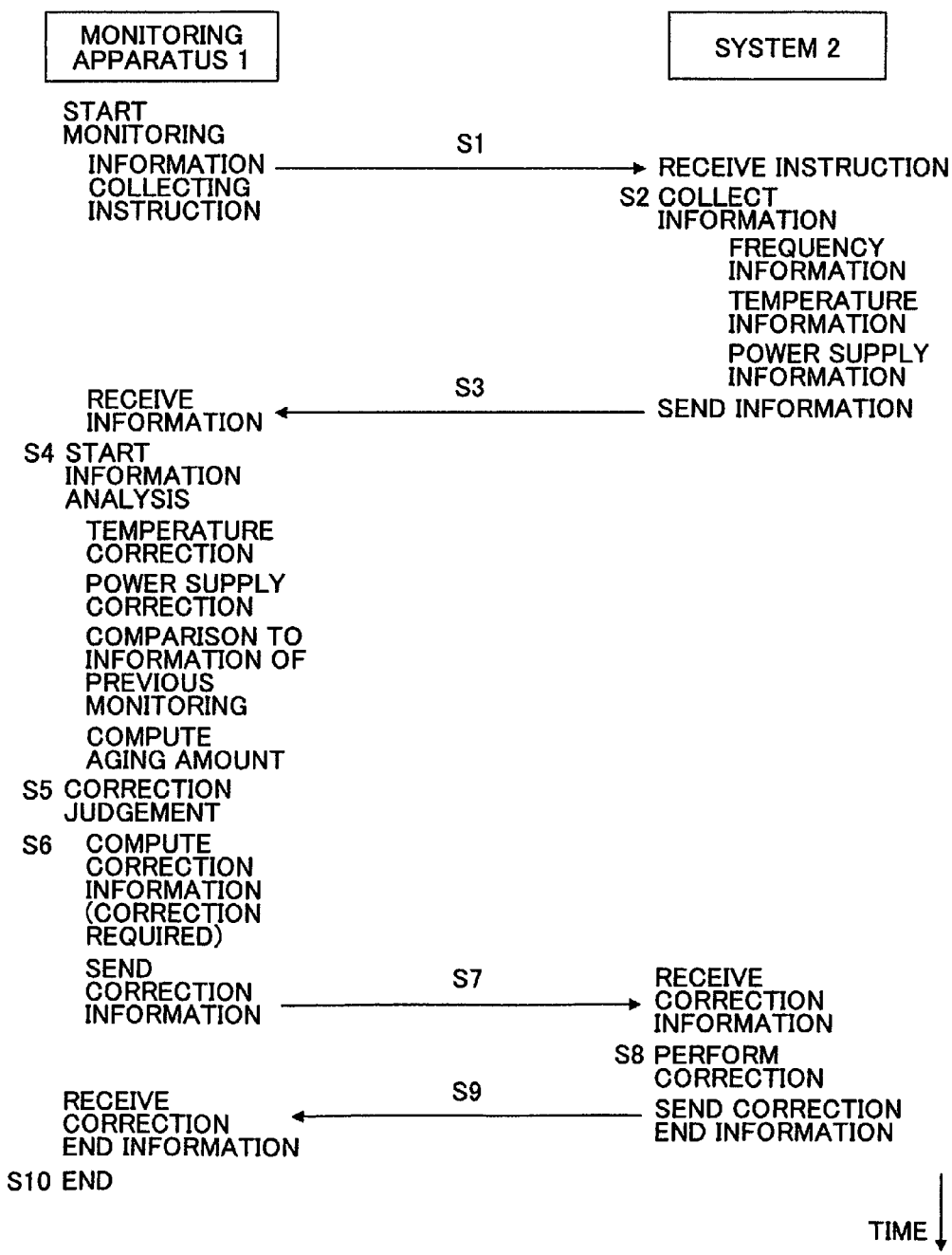
FIG. 8 is a timing chart for explaining a monitoring and control procedure.

FIG. 8 is a timing chart for explaining a monitoring and control procedure. FIG. 8 illustrates the transmission and reception of the information between a monitoring apparatus 1 (1-1 or 1-2) and a system 2 (2-1 or 2-2).

In FIG. 8, when the monitoring process of the monitoring apparatus 1 starts, the monitoring apparatus 1 transmits the information collecting instruction to the system 2 that is the monitoring target, in a step S1. The system 2 performs an information collecting process to collect the frequency information, the temperature information and the power supply information within the system 2, in response to the information collecting instruction, in a step S2. The system 2 transmits the collected information to the monitoring apparatus 1 when the information collecting process ends, in a step S3.

When the monitoring apparatus 1 receives the collected information, the monitoring apparatus 1 starts an information analysis, including the temperature correction, the power supply correction, comparison of values collected during a present monitoring cycle and a previous monitoring cycle, the computation of the aging amount, and the like, in a step S4. The monitoring apparatus 1 judges whether the correction is required, in a step S5. If the judgement result in the step S5 is YES, the monitoring apparatus 1 computes the correction information in a step S6, and transmits the computed correction information to the system 2 in a step S7.

When the system 2 receives the correction information, the system 2 writes the correction information in the memory 25 in order to perform the correction, in a step S8. The system 2 transmits correction end information to the monitoring apparatus 1, in a step S9. When the monitoring apparatus 1 receives the correction end information, the monitoring apparatus 1 ends the monitoring process, in a step S10.

In a case where the communication line 3 illustrated in FIG. 2 is a digital line, the monitoring and control procedure becomes similar to that illustrated in FIG. 8. However, because the oscillation frequency of the oscillator 21 cannot be monitored directly, it is necessary to compute the amount of frequency change of the oscillation frequency by the control part 24 within the system 2-2. In this case, the reference clock that is used for the computation in the control part 24 may be extracted from the carrier clock. In addition, if the system 2-2 is provided with a receiving part that includes an antenna, a clock on the broadcast wave or a clock on the GPS wave may be used as the reference clock. The information related to the amount of frequency change of the oscillation frequency may be obtained and transmitted to the monitoring apparatus 1-2 by extracting a phase error relative to the reference clock in the control part 24, for example, and digitizing the phase error into digital information.

Figure 9:
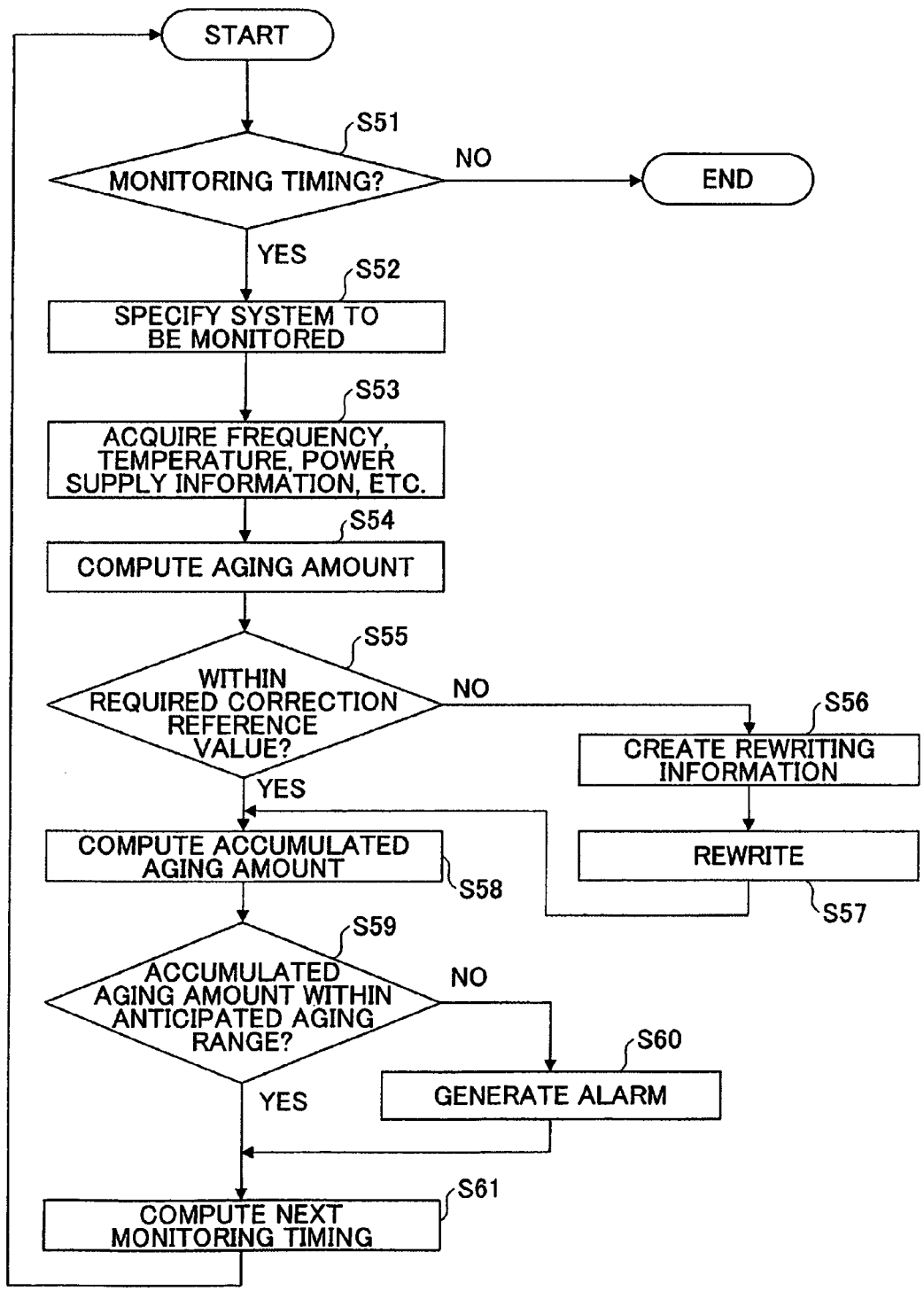
FIG. 9 is a flow chart for explaining a part of the monitoring and control procedure.

FIG. 9 is a flow chart for explaining a part of the monitoring and control procedure, that is, particularly the process related to starting the monitoring process and judging whether the correction is required. In FIG. 9, a step S51 judges whether the monitoring timing (or time) for monitoring the system 2 has arrived. The process ends if the judgement result in the step S51 is NO. On the other hand, if the judgement result in the step S51 is YES, a step S52 specifies the system 2 that is to be monitored, that is, the monitoring target system 2. For example, the monitoring timing is 9:00 AM every day, but the monitoring process does not need to be performed every day. The setting is made so that the monitoring apparatus 1 initially performs the monitoring process every day when the monitoring apparatus 1 is started. However, the aging in general undergoes a logarithmic change as described above. Hence, the monitoring timing occurs at equal intervals on the logarithmic scale, within the anticipated changing range (for example, approximately ±7.8 ppm/decade) of the oscillation frequency, and the monitoring timing becomes every day or occurs at intervals depending on the changing amount at a point in time when a change outside the anticipated changing range is confirmed. More particularly, if a general (logarithmically linear) change of the oscillation frequency is monitored, the monitoring at intervals of 1, 2, 5, 10, 20, 50 or 100 days, for example, is sufficient. Of course, the monitoring interval may be set at shorter intervals in order to cope with a burst change in the oscillation frequency.

A step S53 transmits the information collecting instruction to the monitoring target system 2, in order to receive the state information including the frequency information, the temperature information and the power supply information collected by the monitoring target system 2 (corresponds to steps S1 and S3 in FIG. 8). A step S54 collates the received state information including the frequency information, the temperature information and the power supply information, with the fixed correction information of the oscillator 21 within the monitoring target system 2, and computes the changing amount of the oscillation frequency due to the aging (corresponds to step S5 in FIG. 8).

Next, a step S55 judges whether the computed changing amount of the oscillation frequency due to the aging is within a reference value (±15 ppm). It is judged that the correction is required if the computed changing amount exceeds the reference value. If the computed changing amount exceeds the reference value and the judgement result in the step S55 is NO, a step S56 creates the correction information that is to rewrite the correction information stored in the memory 25 within the system 2, and a step S57 rewrites the correction information stored in the memory 25 within the system by the created correction information (corresponds to steps S5, S6 and S7 in FIG. 8). If the judgement result in the step S55 is YES or, after the step S57, a step S58 computes the accumulated changing amount corresponding to the changing amount for the case where no correction was made. This accumulated changing amount has a value obtained by adding the past accumulated correction amount to the oscillation frequency in a reference environment that takes into consideration the temperature and the power supply voltage.

A step S59 judges whether the accumulated changing amount computed in the step S58 falls within the anticipated aging range. If the accumulated changing amount exceeds the anticipated changing amount and the judgement result in the step S59 is NO, it may be regarded that some kind of an abnormality (destruction or damaged mode) has occurred, and thus, a step S60 transmits an alarm urging replacement of the oscillator 21 to the system 2, for example. If the judgement result in the step S59 is YES or, after the step S60, a step S61 computes the next monitoring timing, and the process returns to the step S51. The alarm may be output from at least one of the monitoring apparatus 1 and the system 2.

Therefore, the frequency changing amount of the oscillation frequency due to the aging may be extracted based on the present and past state information and the fixed correction information. If the extracted frequency changing amount is within a tolerable range that is set in advance, no correction needs to be done until the next monitoring timing. If the extracted frequency changing amount exceeds the tolerable range or, may exceed the tolerable range, the correction information stored in the memory 25 within the system 2 is rewritten by the correction information that is created in the above described manner in order to correct the oscillation frequency. In other words, the oscillation frequency is corrected under the reference environment (at the temperature of 25° C. and the power supply voltage of 3.3 V) using the fixed correction information of the oscillator 21.

Figure 10:
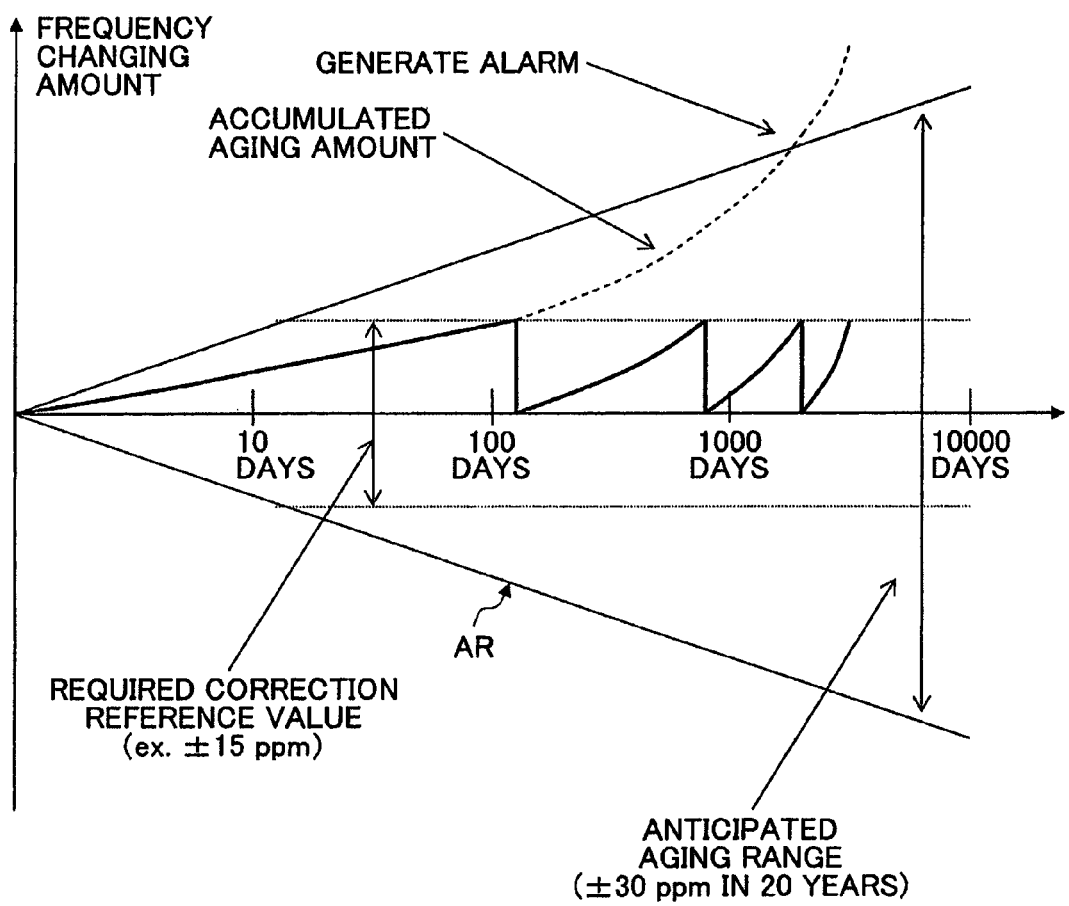
FIG. 10 is a diagram for explaining an example of rewriting control information of the oscillator.

FIG. 10 is a diagram for explaining an example of rewriting the control information of the oscillator. In FIG. 10, the ordinate indicates the frequency changing amount in arbitrary units, and the abscissa indicates the number of days on a logarithmic scale. 20 years is 7300 days, and a large triangular region illustrated in FIG. 10 indicates an anticipated aging range AR, while a bold line indicates the actual frequency change. For the sake of convenience, FIG. 10 illustrates an example in which the correction information is rewritten for the first time in 100 days when the reference value (required correction reference value) indicating whether the correction is required is exceeded.

In FIG. 10, a dotted line indicates the accumulated changing amount for a case where the correction information is not rewritten. In this example, the anticipated aging range is exceeded in a vicinity of 2000 days, and it may be seen that the crystal oscillator element of the oscillator 21 has entered a destruction mode (caused by electrode corrosion or the like) at this point in time. An alarm (such as a message on a display part of the monitoring apparatus 1 indicating that the change in the oscillator 21 exceeds the normal change caused by aging) is generated at this point in time, and it is thus possible to know immediately that the oscillator 21 needs to be replaced. The correction information is rewritten in a normal manner, and the system 2 may operate for a certain time with the oscillator 21 that has yet to be replaced, without stopping the operation of the system 2, that is, without having to put the system 2 to a system down state.

The computer-readable storage medium that stores a program which, when executed by a computer, causes the computer to perform a process to monitor the system having the oscillator, causes the computer to function as the units or means forming the monitoring apparatus of each of the embodiments described above. In other words, the program causes the computer to function as the control part and the computing part of the monitoring apparatus.

In each of the embodiments described above, the monitoring apparatus remotely monitors one or a plurality of systems, and remotely controls the oscillator within each system if necessary. However, the system itself may include the functions of the monitoring apparatus. In this case, the reference clock that is used by the part of the system functioning as the monitoring apparatus may be an external clock, similarly to the case where the digital line is used.

Therefore, the embodiments of the present invention are applicable to various systems having an oscillator with a variable oscillation frequency, such as a programmable oscillator.

Although the embodiments are numbered with, for example, "first" or "second", the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A monitoring apparatus for monitoring a system that includes an oscillator having a variable oscillation frequency, comprising:
    a storing unit configured to store a reference value of state information of the system, including at least frequency information related to an oscillation frequency of the oscillator, and changing amount information, including at least changing amount information related to an anticipated changing amount of the oscillation frequency the oscillator due to aging of the oscillator;
    a transmitting unit configured to transmit an information collecting instruction for collecting the state information of the system to the system at an arbitrary monitoring timing; and
    a control unit configured to perform a control operation that includes transmitting to the system control information for controlling the oscillation frequency to become the reference value or less if the oscillation frequency exceeds the reference value, based on a result of comparing state information collected and received from the system and the reference value of the state information stored in the storing unit, computing the changing amount of the oscillation frequency at least due to aging based on a result of comparing state information collected at a previous monitoring timing and state information collected at a present monitoring timing and the changing amount information stored in the storing unit, and computing a next monitoring timing based on the computed changing amount of the oscillation frequency and storing this next monitoring timing in the storing unit.

2. The monitoring apparatus as claimed in claim 1, wherein the state information includes, in addition to the frequency information, at least one of power supply information related to a power supply voltage of the oscillator and temperature information related to a temperature of the oscillator.

3. The monitoring apparatus as claimed in claim 1, wherein the arbitrary monitoring timing is a starting time of the monitoring apparatus.

4. The monitoring apparatus as claimed in claim 1, wherein the changing amount information includes changing amount information related to a changing amount of the oscillation frequency of the oscillator due to an environment of the oscillator.

5. The monitoring apparatus as claimed in claim 1, wherein the control unit transmits an alarm to the system when the computed changing amount of the oscillation frequency due to the aging exceeds an anticipated aging range.

6. The monitoring apparatus as claimed in claim 1, wherein information between the system and the monitoring apparatus is transmitted and received via a leased line.

7. The monitoring apparatus as claimed in claim 1, further comprising:
    a communication interface,
    wherein the communication interface transmits and receives information between the system and the monitoring apparatus via a communication line.

8. The monitoring apparatus as claimed in claim 1, wherein the control unit operates in response to a reference clock selected from a group consisting of an output of an internal oscillator provided within the monitoring apparatus, an output of an external oscillator provided externally to the monitoring apparatus, a clock on the communication line, a clock on a broadcast wave, and a clock on a GPS wave.

9. The monitoring apparatus as claimed in claim 1, wherein the control unit stores state information received and collected from the system into the storing unit.

10. The monitoring apparatus as claimed in claim 1, wherein:
    the oscillator is formed by a programmable oscillator including an oscillator circuit having a constant crystal oscillation frequency, a PLL circuit, and a memory, and configured to vary an oscillation frequency thereof by processing an output of the oscillator circuit in the PLL circuit based on information stored in the memory; and
    the control information transmitted from the control unit to the system is rewritten in the memory.

11. A computer-readable storage medium that stores a program which, when executed by a computer, causes the computer to perform a monitoring process to monitor a system that includes an oscillator having a variable oscillation frequency, said program comprising:
    a transmitting procedure causing the computer to transmit an information collecting instruction for collecting state information of the system to the system at an arbitrary monitoring timing; and
    a control procedure causing the computer to perform a control operation that includes:
        transmitting to the system control information for controlling an oscillation frequency of the oscillator to become a reference value or less if the oscillation frequency exceeds the reference value, based on a result of comparing state information collected and received from the system and the reference value of the state information stored in the storing unit which stores the reference value of state information of the system, including at least frequency information related to the oscillation frequency of the oscillator, and changing amount information, including at least changing amount information related to an anticipated changing amount of the oscillation frequency of the oscillator due to aging of the oscillator, computing the changing amount of the oscillation frequency at least due to aging based on a result of comparing state information collected at a previous monitoring timing and state information collected at a present monitoring timing and the changing amount information stored in the storing unit, and computing a next monitoring timing based on the computed changing amount of the oscillation frequency and storing this next monitoring timing in the storing unit.

12. The computer-readable storage medium as claimed in claim 11, wherein the state information includes, in addition to the frequency information, at least one of power supply information related to a power supply voltage of the oscillator and temperature information related to a temperature of the oscillator.

13. The computer-readable storage medium as claimed in claim 11, wherein the arbitrary monitoring timing is a starting time of the computer.

14. The computer-readable storage medium as claimed in claim 11, wherein the changing amount information includes changing amount information related to a changing amount of the oscillation frequency of the oscillator due to an environment of the oscillator.

15. The computer-readable storage medium as claimed in claim 11, wherein the control procedure transmits an alarm to the system when the computed changing amount of the oscillation frequency due to the aging exceeds an anticipated aging range.

16. The computer-readable storage medium as claimed in claim 11, wherein the control procedure causes the computer to store the state information collected and received from the system in the storing unit.

* * * * *